United States Patent [19]

Cuneo et al.

[11] 4,080,513
[45] Mar. 21, 1978

[54] MOLDED CIRCUIT BOARD SUBSTRATE

[75] Inventors: Edward A. Cuneo, Westminster; Makoto Kato, Santa Ana; Michael S. Wilson, Costa Mesa; Aaron L. Pinkerton, El Toro, all of Calif.

[73] Assignee: Metropolitan Circuits Incorporated of California, Costa Mesa, Calif.

[21] Appl. No.: 628,086

[22] Filed: Nov. 3, 1975

[51] Int. Cl.² .............................................. H05K 1/00
[52] U.S. Cl. .................................................. 174/68.5
[58] Field of Search ................ 174/68.5; 428/920, 921

[56] References Cited

U.S. PATENT DOCUMENTS

| | | | |
|---|---|---|---|
| 3,378,434 | 4/1968 | Harrington | 428/921 |
| 3,514,538 | 5/1970 | Chadwick et al. | 174/68.5 |
| 3,526,573 | 9/1970 | Kepple et al. | 428/921 X |
| 3,812,019 | 5/1974 | Needham et al. | 174/68.5 |
| 3,836,557 | 9/1974 | Knowles | 428/921 X |
| 3,985,928 | 10/1976 | Watanabe et al. | 428/920 X |
| 3,996,142 | 12/1976 | White et al. | 428/921 |

Primary Examiner—Arthur T. Grimley
Attorney, Agent, or Firm—Harold L. Jackson; Stanley R. Jones; Joseph W. Price

[57] ABSTRACT

The present invention is directed to a method of preparing a substrate to improve the adherence of a metallic coating to the substrate and the product thereof. More particularly, a method of manufactiring a molded circuit board and unique circuit board produced thereby, is disclosed. A molding compound, such as an epoxy resin is blended with a plating additive, such as calcium carbonate that is relatively inert to the molding compound. The blended mix can then be molded into a desired shape which, for a printed circuit board, can be a relatively flat plate configuration with a recessed groove and hole formation pattern. The high relief areas of the circuit board can be masked with a protective material. The plating additive can then be chemically etched from the grooved recessed area and holes, for example, by a hydrochloric acid bath. Appropriate catalyst and accelerators can be applied to the recessed groove pattern before the protective mask material is removed. In one embodiment, an electroless plating nickel material can be deposited to permit it to penetrate the interstices or cavity pattern, left in the recessed groove and hole pattern by the etching of the plating additive. Copper can then be applied to the nickel pattern in the recessed grooves, for example, by dipping the substrate in an electroless plating copper solution. The substrate is heated to cure the epoxy resin for mechanically locking the metallic coating in the interstices, or cavities, left by the etching of the plating additive.

9 Claims, 4 Drawing Figures

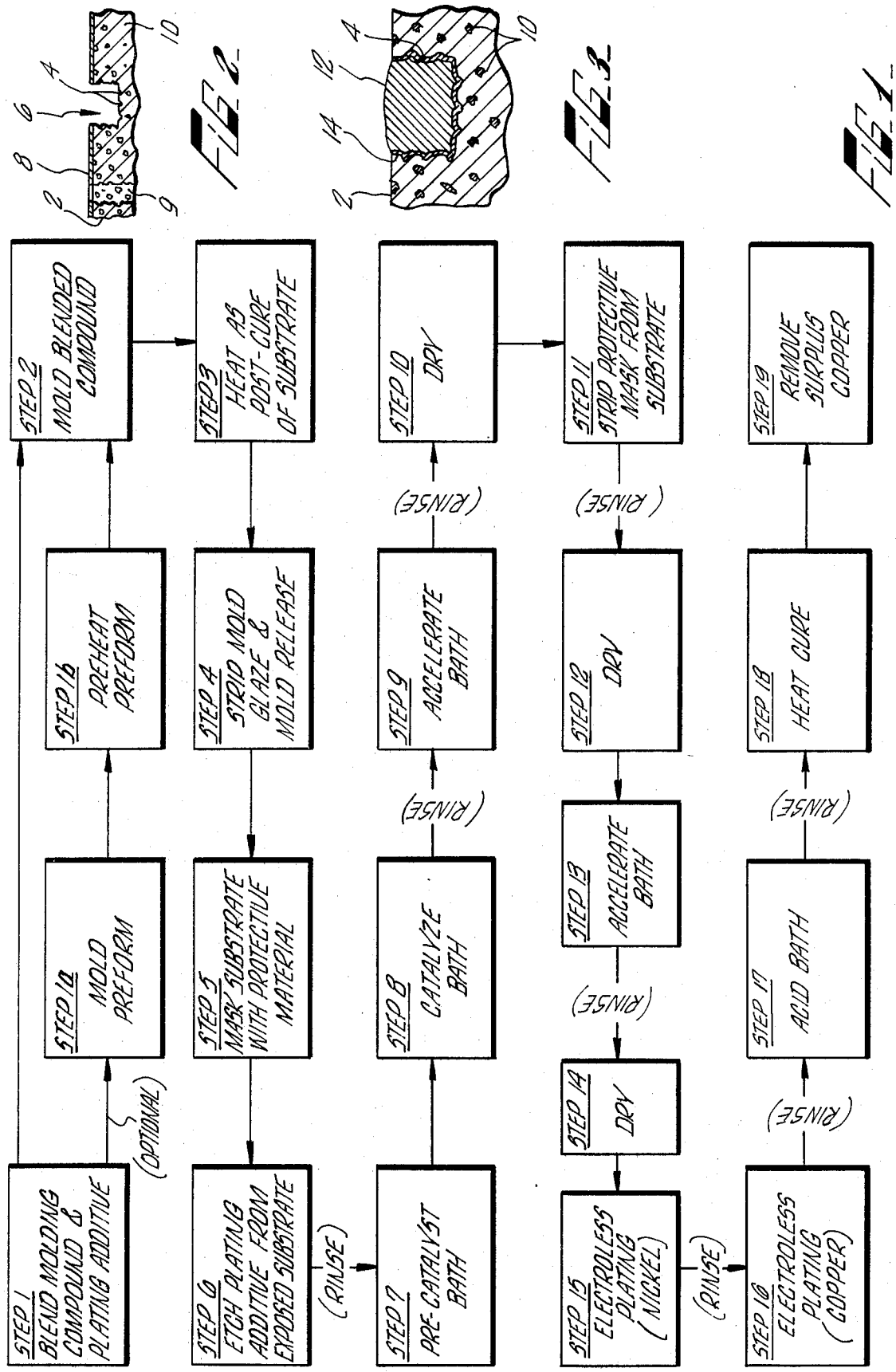

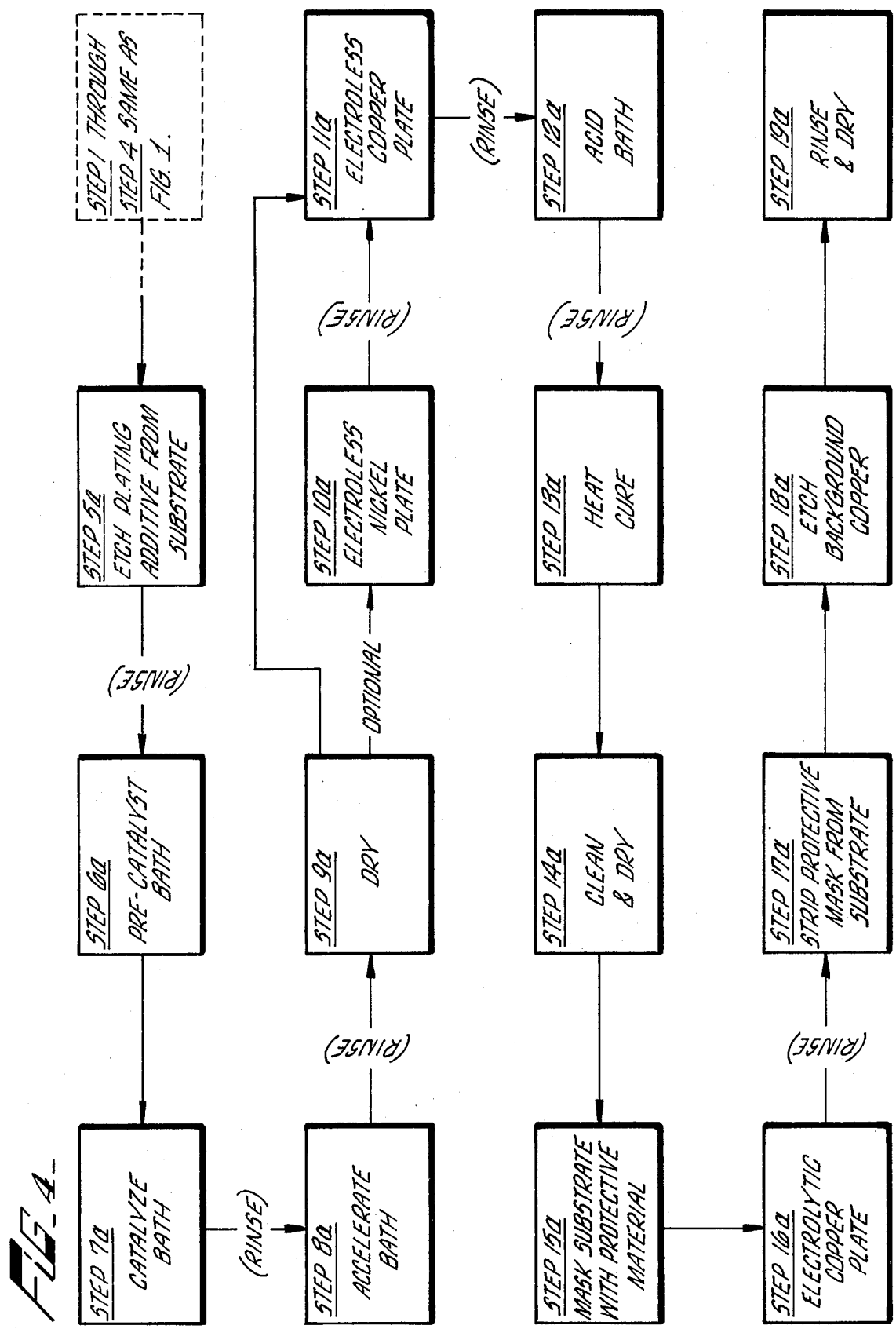

MOLDED CIRCUIT BOARD SUBSTRATE

BACKGROUND OF THE INVENTION

1. Field of the Invention

The present invention relates generally to a method of preparing a surface for plating and a product thereof. More particularly, the invention is directed to a method of manufacturing a highly advantageous circuit board substrate for plating a conductive material thereto and the circuit board product thereby.

2. Brief Description of the Prior Art

The evolution of the printed circuit board has progressed at an accelerated pace over the last 25 years. In this regard, a number of processes and resultant printed circuit boards have been suggested to meet the demands of modern industry. A particularly vexing problem has been the adherence, or affixing, of a conductive metallic layer to the insulating substrate. Generally, the prior art has found that an adequate adhesion for a metal deposit is evidenced by a peel strength of at least 5 lbs./in. This problem has become more acute as the miniaturization of circuit boards has progressed. Other problems exist, such as the susceptibility of the conductive patterns to physical damage on the surface of the substrate, the strength of the circuit board, the economy of production, the desire to have a fire resistant substrate, adequate plating of holes, and the desire to have a relatively non-porous substrate surface between the conductive patterns.

The achievement of an optimum substrate surface for the affixing of the conductive layer to the substrate, while at the same time providing intermediate surface areas that are not absorbent, or porous, to moisture has been difficult. One approach has been to sandblast the normally glossy surface of a plastic resin substrate thereby roughing the surface to increase the adherence of the metal to the roughened portions of the surface. A refinement of this method is to mask the substrate area so that only the conductive pattern area is subject to the sandblast. Another approach, disclosed in the Cado U.S. Pat. No. 3,042,591, has been to provide serrations on the debossing dies to actually mold a serrated roughened surface into the substrate.

Another popular method of preparing a substrate surface is the swell and etch technique wherein the surface of the substrate is actually swelled and then etched with an appropriate chemical to degrade the plastic surface so that it is receptive to metal plating such as disclosed in the Dinella, et al., U.S. Pat. No. 3,758,332, and the Davis, et al., U.S. Pat. No. 3,560,241.

Another method as represented in the U.S. Pat. No. 3,666,549, granted to Rhodenizer, et al., the Grunwald U.S. Pat. No. 3,620,933, and the Watanabe U.S. Pat. No. 3,552,085 is the clad and strip process wherein the substrate is coated with an appropriate metal, such as copper, or aluminum, and then subsequently stripped to provide an irregular surface for affixing the desired conductive pattern.

Other approaches, such as the Mickelson, et al., U.S. Pat. No. 3,434,939 have used adhesive, or similar bonding agents, to fasten an electrically conductive metal to the substrate.

The Greenman, et al., U.S. Pat. No. 2,986,804 provides a three dimensional circuit board with appropriate ribs for reinforcing the board.

The Bell, et al., U.S. Pat. No. 2,925,645 discloses a process for adhering a metal foil to a plastic substrate. In this regard, powder particles are attached to the foil by adhesion or a technique of sintering. The foil is then pressed and heated to provide a mechanical bonding with the substrate surface.

The Luce, U.S. Pat. No. 3,293,109 discloses an irregular lamina surface coated with a copper foil. The Blessinger, et al., U.S. Pat No 3,895,132 discloses a method of creating a random surface pattern on articles.

The Lando, U.S. Pat. No. 3,900,614, Shepard, U.S. Pat. No. 3,851,621, Parfet, U.S. Pat. No. 3,800,020, Wharton, U.S. Pat. No. 3,077,658, Malcolm, U.S. Pat. No. 2,772,501, McReadie, U.S. Pat. No. 2,955,351, Shipley, Jr., U.S. Pat. No. 3,011,920 and Tsu, et al., U.S. Pat. No. 3,212,918 are cited of general interest for various methods of making a printed circuit board.

The O'Shaughnessy, U.S. Pat. No. 3,897,387, Touval, U.S. Pat. No. 3,897,389, and Vogel, U.S. Pat. No. 3,897,346 are cited to disclose various flame retardant agents for synthetic plastics.

As can be appreciated by those skilled in the art, there is still a desire to provide an efficient and economical method of adhering a metal conductive layer to a non-conducting substrate which will adequately meet all the demands upon a printed circuit board that are presently being made by industry.

SUMMARY OF THE INVENTION

The present invention provides an improved method of manufacturing an object onto which a metal plate coating can be affixed. More particularly, the present invention discloses a preferred method of manufacturing a circuit board and a unique circuit board produced thereby. In this method, a molding compound, such as an epoxy resin, is blended or mixed with a plating additive which is relatively inert to the molding compound. The particle size of the plating additive is optimally picked to provide the most advantageous cavity structure on the surface of the epoxy resin when it is formed as a substrate. The plating additive may also be a flame retardant additive. The blended molding compound is appropriately molded in a die mold under pressure and heat. The resultant molded substrate with a recessed groove pattern is then heated as a post-cure treatment with a subsequent sandblasting to strip the glaze and mold release agents from the surface of the substrate. The substrate is then masked with a protective material, for example, by a roll resist technique, or silk screening, over the high relief surfaces on the substrate. The plating additive, such as calcium carbonate, can then be etched from the substrate surface on the exposed or unprotected areas in an etchant solution, such as hydrochloric acid.

After a water rinsing step, the substrate is placed into a precatalyst dip to both cleanse the substrate and to preserve the purity of the subsequent catalyst bath. The substrate is then placed into an activator solution such as palladium tin colloid bath, rinsed with water and then placed into an accelerator, or sensitizer bath. The substrate is removed from the accelerator bath, rinsed with water and then dried. The photoresist, or protective mask is then removed, for example, by a spray bath to remove both the catalyst on the mask and also the protective resist material. The substrate is again rinsed in water and then dried and can be placed in an accelerator bath as an optional step simply to insure that the catalyst has been properly activated in the desired groove recesses of the substrate. The substrate is then rinsed in a water bath and placed in an electroless nickel bath. The catalyst will coact with the nickel and permit it to penetrate the etched cavities left in the surface of the epoxy resin in the recessed grooves and holes. Once again, the substrate is rinsed with water and subsequently placed in an electroless copper bath to deposit the final conductive metal plating on the nickel pattern. The copper plated substrate is then rinsed in water and dipped in a sulfuric acid bath to insure a clean copper surface. The copper clad surface is then rinsed in water and heat-cured to increase the bonding between the epoxy resin substrate and the conductive metal plating.

The resultant metal plated object, such as a circuit board, includes a non-conductive substrate formed of a mixture of a molding compound and a relatively inert plating additive. The recessed groove and hole surface of the substrate has the plating additive substantially removed from the surface area to provide a recessed surface configuration characteristic of the exposed plating additive particles removed to leave a resultant cavity impression of those particles. The remainder of the substrate surface, which will generally be the high relief areas in a circuit board, can be a combination of the plating additive and the epoxy resin. One or more conductive materials will be bonded to the substrate in the grooves and holes and will extend into the cavity impressions to thereby improve the adhesion strength of the conductive material to the substrate.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings.

BRIEF DESCRIPTION OF THE DRAWINGS

FIG. 1 is a block diagram of the process steps of the present invention;

FIG. 2 is a schematic cross-sectional view of the circuit board substrate after Step 6;

FIG. 3 is a schematic cross-sectional view of a circuit board of the present invention; and FIG. 4 is a block diagram of an alternative series of process steps of the present invention.

DESCRIPTION OF THE PREFERRED EMBODIMENT

The following specification taken in conjunction with the drawings set forth both the process steps and the product of the present invention in such a manner that any person skilled in the art can utilize the invention. The embodiments of the invention disclosed herein are the best modes contemplated by the inventors in carrying out their invention in a commercial environment, although it should be understood that various modifications can be accomplished within the parameters of the invention.

The present invention is directed primarily at increasing the bond strength of a metal coating to a non-conductive substrate, and more particularly, to a plastic circuit board substrate. The problem of increasing the peel strength of deposited metal is well known and presently, the industry is resorting to a swell and etch technique or a clad stripping technique. Reference is made to the Dinella, et al., U.S. Pat. No. 3,758,332 and Schneble, et al., U.S. Pat. No. 3,033,703, to disclose known material and process procedures, and their specific teachings are incorporated herein by reference to supplement the present disclosure.

Reference is made to FIG. 1 which discloses a schematic flow diagram of the major process steps in the fabrication of a printed circuit board.

Starting with Step 1, a molding compound, such as a wet or powder epoxy resin, of the type manufactured by the Minnesota Mining and Manufacturing Co. as 3M 265 epoxy resin, is appropriately blended in a blending machine with a plating additive, such as calcium carbonate, antimony oxide, magnesium oxide, zinc borate, calcium borate, or the like materials that have the characteristics of being relatively inert to both the molding compound and the various additives while at the same time being easily removable, for example, by chemical etching in a solution that does not adversely affect the epoxy resin molding compound during the removal time period. The particle size of the plating additive has been picked to optimize the mechanical interlocking of the epoxy substrate with the deposited conductive layer after a heat treating, or shrinking, process step. In this regard, for example, the particle size for calcium carbonate would be in the range of 0.2 to 50 microns, with an average size of 2.5 to 18 microns, and comprises approximately 10 to 30 percent by weight of plating additive to molding compound. The exact percent can vary depending on the desired amount of substrate cavities, but 15 percent is preferred.

Various forms of epoxy resins can be utilized, such as thermo setting plastics. Other forms of non-conducting substrates can be utilized including many of the synthetic resins, glasses, thermo plastics and ceramics, as long as the plating additive particles can be removed. The epoxy resin can be mixed with milled glass fibers to provide reinforcement and strength, and further, with a flame retardant of, for example, the halogen family, hydrated alumina, or antimony trioxide. An example of one type of flame retardant is the Hooker Chemical Dechlorane Plus 25. Other types of flame retardants for use in plastics are known in the prior art. As will be disclosed subsequently, it is even possible to pick a flame retardant additive, such as antimony trioxide to serve the dual function of both a plating additive and a flame retardant. As can be appreciated in the molding art, mold release agents, such as calcium stearate or microcrystalline wax may be utilized. Also, various colorants can be added to the epoxy resin, such as blue or green pthalocyanine or carbon black. As used herein, the term molding compound will include those additives that are normally included, such as various colorants, reinforcement fibers and flame retardants.

After the molding compound and the plating additive have been thoroughly mixed in either the wet or dry state to obtain homogeniety, it is possible to store the blended molding mixture in a preform state. In this regard, reference is made to Step 1(a) wherein the blended molding mixture can be roughly molded by heating the mixture to 200° F until the material fuses and is then cooled for storage. A shelf-life for the preform molding compound has been estimated to be at least 1 year at 100° F temperature. If the blended mixture has been preformed, it is necessary to preheat the preform as shown in Step 1(b) before insertion into the mold die.

In Step 2, the molding compound mixture is placed in a steel die in the form of a preheated preform, powder or liquid mix. The preheating of the preform is simply to soften the preform and prevent any damage to the circuit pattern of the die. As is fully understood in the art, separate circuit patterns can be molded on both sides of the substrate and are preferably molded as recessed grooves with a required hole pattern. The molded substrate is then removed from the die and heated in Step 3 for a short period of time, about 10 minutes at approximately 350° F, as a post cure of the substrate material. As will be appreciated by those skilled in the art, the time-temperature parameters for heating and curing are interdependent. This interdependency is one which is well known in the art, or can be readily determined by trial and error.

The surface of the molded substrate is then abraded, for example, by sandblasting as Step 4 to strip the mold glaze and any mold release agents from the surface of the substrate. Step 4 further serves the purpose of exposing the plating additive particles on the surface of the substrate and removing any flash in molded holes.

In Step 5, the high relief areas of the substrate adjacent the recessed grooves are coated with a protective material, such as a photoresist KTFR manufactured by Kodak. Other protective materials, such as silk screen ink, can be used as is well known in the art. The resist may be applied in any manner, for example, by a roller, or screen, and is characterized as being viscous enough not to roll down into the recessed grooves and holes that were molded by the mold die. Reference is made to the Cado, U.S. Pat. No. 3,042,591 to illustrate various methods of applying protective material to a substrate surface. As a result of Step 5, the indented or recessed groove and hole pattern which is desired to be coated with a conductive material is left exposed and both the epoxy resin and plating additive particles are accessible on the bottom and sides of the grooves and holes, as can be seen more particularly in FIG. 2.

The resist coated substrate is then dipped for a short period of time in an appropriate etchant solution, for example, a hydrochloric acid solution of 5 to 100 percent by volume of hydrochloric acid from 30 seconds to 30 minutes to dissolve, or etch away, the calcium carbonate particles. An acid bath of 25 percent hydrochloric acid and 75 percent deionized water with a soaking period of 3 minutes has been successfully used at room temperature, e.g., 60° F to 80° F. It should be realized that the strength of the acid bath, the temperatures and the soaking time are interdependent and can be subjectively varied. A few drops of a wetting agent, such as a commercially available liquid detergent, can be added to the acid bath. The etching process of Step 6 is important in removing the plating additives from the exposed grooves in the substrate. As mentioned above, the choice of both the acid bath and plating additive must be compatible to the epoxy resin molding compound and not adversely deteriorate the substrate surface. Thus, a relatively rough epoxy resin surface can be selectively provided on the substrate in only the desired exposed image groove pattern. This has been accomplished in a highly efficient and economic manner by a simple chemical etching step. The resultant surface of the recessed image groove pattern will be substantially only the epoxy resin compound having a plurality of cavities that are representative of the former position of the plating additive particles. For molded objects other than the circuit board substrates, the image pattern will be subjectively determined and can even cover the entire surface.

It is possible to reverse Steps 5 and 6 and chemically etch the plating material from the entire substrate before coating the high relief areas with a protective material. By chemically etching the substrate first, the entire substrate surface and holes will have a plurality of cavities. The protective material that would subsequently be applied to the high relief areas would protect the cavities in the high relief areas from receiving any catalyst material, and accordingly, metal will not be subsequently deposited on the high relief areas.

The substrate is then appropriately rinsed in a spray, or water bath, for example, of deionized water, and then dipped in a precatalyst bath consisting generally of hydrochloric acid with, for example, a Shipley 6F solution as Step 7 for approximately 2 to 3 minutes. The actual steps of depositing a metal on the substrate surface can be varied within the knowledge of the prior art and the following steps are merely illustrative of the present preferred embodiment and should not be considered limiting to the scope of the present invention. Reference is made to Metallic Coating of Plastics, William Goldie, Electrochemical Publications, 1968 for various known sensitizers, activators and procedures.

The substrate is then removed from the precatalyst bath and submerged in a catalyst bath as Step 8. A tin palladium colloid solution, such as the commercially available Shipley 9F can be utilized as the catalyst or activator. Depending on the concentration of the catalyst, the substrate can be exposed for a time period of 1 to 60 minutes at room temperature. The substrate is removed and rinsed with deionized water. Again, it is to be understood that the various activating metal ions, e.g., Pd +2, and their solutions, conditions, and procedures of activation are well known in the prior art. The catalyst is designed to facilitate the deposition of the desired metal coating in the exposed recessed image grooves and holes as is well known in the prior art.

Generally, the sensitization of the substrate recesses and holes, consists of depositing, or absorbing a sensitizing species for a time period of 1 to 30 minutes depending on concentration in the plating additive cavities. The accelerator can be any of a number of commercially available accelerators that would be compatible with the selected catalyst, for example, a Shipley Accelerator 19 could be utilized. The prime importance is to provide an activated surface on the exposed plating image pattern, and particularly, in the plating additive cavities. The substrate is removed from the accelerator bath and rinsed in deionized water and then racked as Step 10 to drain dry at a temperature range of 100°–120° F.

In Step 11, the protective photoresist mask that was applied in Step 5, or Step 6, is stripped from the substrate to remove the catalyst above the protective mask and also the mask material itself. The stripping procedure can be accomplished in a conventional spray machine. The stripper can be organic liquid which rapidly removes photoresists (and silk screen resists from the substrate surface), such as the Kodak Stripper "K", and Shipley Remover 1112A. The stripper can operate at room temperature and can either wrinkle or dissolve the resist depending on the type of resist and the degree of curing to which it has been subjected. The immersion time will depend on a number of factors such as the precleaning of the substrate, curing times, temperatures, degree of exposure, etc. Generally, the immersion time is less than one minute, but can easily be determined by anyone skilled in the art. Most importantly, the surplus catalyst and accelerator on the high relief areas of the protective material, such as silk screen resist, will be removed and will not be present in any cavities, if there are any, on the high relief areas.

As noted above, Step 6 can be reversed with Step 5, to provide cavities across the entire substrate surface. Again, the substrate is rinsed in deionized water and is re-racked for drying in Step 12.

Step 13 is an optional step and consists in again submerging the substrate in an accelerator bath, for example, Shipley Accelerator 19 to, in effect, be sure that there has been sufficient activation of the catalyst material in the recessed image groove pattern of the substrate. The submerging, or exposing time, can vary from 4 to 30 minutes, again depending on concentration, temperatures, etc. It is believed that the plating additive cavities increase the concentration of catalyst and accelerators in the desired image groove and hole pattern. The substrate is again rinsed with deionized water preparatory to the deposition of a metal in the recessed image groove pattern and dried in Step 14.

In Step 15, the first plating can be accomplished, for example, with an electroless plating solution of nickel or copper. Again, commercial electroless nickel or copper solutions are available, such as the MacDermid 9340 solution or Shipley CP-74. The exposure time can be approximately 5 to 10 minutes at a temperature range of 80° to 90° F. As mentioned earlier, other forms of coatings can be deposited and various methods can be used to apply the coating including dipping, spraying, brushing, spin coating, etc. The catalyst coacts with the metal such as nickel, and due to the fine grain nature of the nickel, it penetrates into the interstices, or cavities, having active material left behind in the epoxy resin surface of the recessed grooves and holes. Thus, the deposited nickel penetrates into the former sites of the plating additive particles in the epoxy resin to provide anchoring points to affix the conductive metal plating in the recessed image grooves and holes of the substrate. Other forms of metal electroless material, such as copper could be used in Step 15.

The substrate is then removed from the electroless plating nickel bath and rinsed with deionized water prior to being submerged in an electroless copper bath for completing the depositing of a conductive metal in the recessed image grooves and holes of the substrate. Approximately 1 to 3 mils thickness of copper is deposited. As can be appreciated, the exposure time and temperature can be subjectively determined depending on the desired thickness, and it is known in the prior art, to vary these parameters to achieve a predetermined thickness. Again, commercially available electroless copper solutions are available, such as Shipley CP-74. It is also possible in some applications to use the initial nickel layer for a conventional electroplating treatment. After the depositing Step 16, of applying the copper to the recessed image grooves and holes, the substrate is removed and rinsed with deionized water.

If necessary, an optional Step 17 can be utilized wherein the substrate is dipped in an acid bath, for example, a sulfuric acid, to be sure that all the electroless solutions and alkaline films are removed and to provide a clean copper surface to the conductive plating that has been anchored to the substrate. The various process steps, such as Step 17, may remove any exposed plating additive particles on the high relief areas, especially those subsequent process steps after the protective photoresist material is removed in Step 11; however, the exposed cavities will not have active material, or at least sufficient active material, to permit metal depositing in Steps 15 and 16.

Again, the substrate is rinsed in water and in Step 18, the substrate is cured for approximately two hours at 250° F, to shrink the epoxy resin substrate, and thereby, increase the bond strength, and it is believed that mechanical locking of the deposited metal in the plating additive cavities occurs during the curing. If necessary, the substrate can be optionally abraded as Step 19, to simply contain the desired conductive copper pattern only within the circuit image area. The optional abrading of Step 19 may remove a sufficient depth of substrate surface from the high relief areas to remove the cavities and again, expose plating additive particles. As can be appreciated, any additional contact or tip area portions of the conductive substrate can be selectively sanded or abraded, if necessary. The resultant conductive pattern has been found to have a peel strength in the range of 4 to 11 lbs./in.

An alternative embodiment of the present invention can utilize the flame retardant material in a particulate form as a plating additive. In this regard, no additional plating additive would be necessary, and accordingly, it should be realized that the term plating additive in the claims are to include this embodiment unless so limited as a flame retardant. For example, antimony trioxide having a particle size in the range of 0.2 to 50 microns can be appropriately blended into the molding compound, and subsequently, molded into a printed circuit board substrate. The resultant substrate is prepared for etching as noted above in Steps 4 and 5. The etchant solution will again be hydrochloric acid; however, it will be heated to a temperature range of 120° to 150° F. The substrate will be submerged in the etchant solution for a time period of 5 to 15 minutes, depending on the desired concentration of the etchant solution. Again, it is to be understood that the time, temperature and concentration ratios are interdependent and can readily be varied by a person skilled in the art to achieve the desired etched circiut board substrate.

Referring to the schematic cross-sectional view of the circuit board substrate in FIG. 2, the protective resist coated substrate has had the plating additive particles such as calcium carbonate, or a flame retardant, etched away to provide the desired cavities. The substrate 2 has a plurality of these cavities 4 in the exposed recessed groove 6 image pattern and the bore, or hole 9. The protective material 8, such as a silk screen resist, protects the high relief areas of the substrate 2. The plating additive particles 10 have only been etched in Step 6 from the exposed recessed groove image area. As noted earlier, it is possible to etch the entire substrate surface prior to applying the silk screen 9 in the high relief areas. In that case, the silk screen resist material 8 would be relied upon to prevent the deposition of active material into the resulting cavities on the high relief area during the process Steps 8 and 9. It is also possible to select materials for use in Steps 13, 15, 16 and 17 that may remove the plating additives from the high relief areas.

FIG. 3, discloses a schematic cross-sectional view of the finished circuit board substrate 2 and the deposited conductive nickel 14 and copper 12. The nickel was deposited in the Step 15 electroless plating, apparently, as a result of the depositing of the active material during Steps 8, 9 and 13, into the cavities. The nickle 15 forms a fine grain thin layer and facilitates the electroless plating of the copper 12 in Step 16. It is possible to omit Step 15 and simply deposit only copper. The heat curing of the epoxy resin substrate in Step 18 is believed to help increase the mechanical bonding between the nickel and copper protrusions that have been deposited within the cavities 4 of the recessed groove 6. As can be seen from the surface surrounding the conductive pattern in FIG. 3, a subsequent abrasive step has assured that the high relief areas are a planar surface of a composite blend of the plating additive particles 10 and molding compound. As is known in the prior art, an appropriate sealing material can then be placed across the circuit board.

While FIG. 3 schematically discloses the preferred finished product, it should be realized that the high relief areas can have cavities resulting from an incidental etching, or an intentional etching, of the entire substrate surface. However, the important feature is that the protective mask of Step 5 has prevented active material from the process Steps 8, 9 and 13, from activating any cavities in the high relief areas of the substrate surface. Accordingly, the nickel and copper will only be deposited in the desired holes and recessed groove image area.

Referring to the block diagram of FIG. 4, a modification of the process disclosed in FIG. 1, can be utilized within the parameters of the present invention. In this modified process of manufacturing a printed circuit board, Steps 1 through 4 would be the same as that disclosed with respect to FIG. 1.

In Step 5a, the circuit board substrate is dipped for a short period of time in an appropriate etchant solution, such as the hydrochloric acid bath mentioned in the process of FIG. 1 to dissolve, or etch away, the plating additive particles, such as calcium carbonate particles. The etching process of Step 5a is important in removing the plating additives from the exposed surfaces of the holes and grooves in the substrate.

The substrate is then appropriately rinsed in a spray, or water bath, for example, of deionized water, and then dipped in a precatalyst bath consisting generally of hydrochloric acid with, for example, a Shipley 6F Solution as Step 6a for approximately 2 to 3 minutes.

The substrate is then removed from the precatalyst bath and appropriately rinsed before being placed in a catalyst bath as Step 7a. The tin palladium colloid solution mentioned earlier, can be utilized in Step 7a. Depending on the concentration of the catalyst bath, the substrate can be exposed for a time period of 1 to 60 minutes at room temperature. The substrate is then removed and rinsed with deionized water.

IN Step 8a, an accelerator bath of any number of commercially available accelerators that are compatible with the selected catalysts is utilized to provide an activated surface on the exposed plating image pattern and holes, and particularly, in the etched plating cavities. The circuit board substrate is removed from the accelerator bath and then racked appropriately in Step 9a to drain dry at a temperature range of 100° to 120° F.

The substrate is now prepared for receiving a layer of metal from an appropriate electroless metal solution. Step 10a is an optional step in that an initial thin layer of nickel can be deposited in Step 10a with an electroless nickel plating solution. In the alternative, Step 10a can be eliminated and the circuit board substrate can be placed directly in the electroless copper plating solution of Step 11a. If an initial thin layer of electroless nickel is to be deposited in Step 10a, the substrate will be washed in deionized water before it is submerged in the electroless copper plating solution of Step 11a for approximately 30 minutes to deposit about 0.1 mil of copper across the entire surface of the substrate.

The specific choices of electroless nickel or copper solutions and their exposure time and temperature ranges, are well known and for example, have been mentioned with regard to the first embodiment of FIG. 1. Accordingly, it is not necessary to again specify these particulars to a person skilled in the art.

If necessary, the metal cladded circuit board substrate can be dipped in an acid bath in Step 12a to be sure that all the electroless solutions and alkaline films are removed and to provide a clean copper surface on the conductive plating that has been anchored to the substrate. The acid bath can be, for example, 1 to 2% by volume sulfuric acid with an immersion of approximately 1 minute. The time and temperature parameters can be subjectively determined within the skills of artisans in this field.

The substrate is then rinsed in deionized water and can be heat cured as Step 13a for approximately 2 hours at 250° F to shrink the epoxy resin substrate, and thereby, increase the bond strength.

If necessary, the substrate can be appropriately cleaned and air dried to remove any oxidation of the copper surface as Step 14a.

The metal coated substrate is then masked with a protective material in Step 15a, such as a photoresist KTFR manufactured by Kodak. Other protective materials, such as silk screen ink, can be used, as is well known in the art and as described earlier in the process steps of FIG. 1. The protective material, if it is photoresist, can then be developed as well known, to provide a desired image pattern on the copper clad surface.

The substrate can then be appropriately electrically connected and placed in an electrolytic copper solution, such as a MacDermid acid copper bath at room temperature with 20 to 30 amps per square foot until 1 to 3 mils of copper is deposited as in Step 16a. The substrate is then removed, rinsed, and the protective material mask can then be stripped in Step 17a again, as well known in the prior art and as described earlier with respect to the embodiment of FIG. 1.

The substrate can then be etched, for example, with a bath of ferric chloride at 80° to 90° F for approximately 1 minute to remove the thin layer of copper that was beneath the protective mask. Other etchant solutions can be utilized and, as will be appreciated by those skilled in the art, the time, temperature and volume percent of the etchants are interdependent and can be subjectively varied.

The substrate can then be rinsed and dried in Step 19a, and if desired, any surplus copper can be appropriately removed with selective abrasion.

As can be appreciated, many of the parameters of the above process can be varied since they are interdependent in terms of time, temperature, concentration, etc. Accordingly, the present invention should be determined solely from the following claims, in which:

We claim:

1. A molded circuit board substrate adapted to support a conductive pattern comprising:
   a non-conductive substrate body of at least two different materials, one material being a molding compound and the other material a particulate additive flame retardant, the respective materials blended together, molded and solidified, the substrate body having molded recessed grooves and holes which form a surface portion of the substrate body to which the conductive pattern material is to adhere, said conductive pattern surface portion having substantially only the molding compound formed into a surface configuration characteristic of the blended substrate with the exposed surface additive flame retardant particles chemically dissolved to leave resultant cavity impressions where the surface particulate additive flame retardant had been supported by the molding compound, the interior of the non-conductive substrate body having the additive flame retardant particles blended throughout the molding compound.

2. A circuit board formed from a molding process comprising:
  a non-conductive substrate body formed of a blend of at least two different materials, one material being a molding compound and the second being a particulate material in the approximate size range of 0.2 to 50 microns which is relatively inert to the molding compound, the particulate material comprising approximately 10 to 30 percent by weight to the molding compound, at least one surface of the substrate body having a molded recessed predetermined groove pattern wherein that portion of the second particulate material exposed in the groove pattern is substantially removed by being chemically dissolved from the surface of the recessed pattern to provide a recessed groove surface configuration having resultant cavity impressions of the removed particulate material with approximate diameters of 0.2 to 50 microns, the interior of the substrate body comprising both the molding compound and particulate material intermixed together; and
  a conductive material bonded to the substrate body in the recessed predetermined groove pattern and extending into the cavity impressions to improve the adhesion of the conductive material to the substrate body to at least a peel strength in the range of 4 to 11 lbs./in.

3. The circuit board of claim 2 wherein the second particulate material is selected from the group consisting of calcium carbonate, antimony oxide, magnesium oxide, zinc borate, calcium borate and antimony trioxide.

4. The circuit board of claim 3 wherein the molding compound is an epoxy resin.

5. The circuit board of claim 2 wherein the first particulate material is a flame retardant.

6. The circuit board of claim 2 wherein the recessed predetermined pattern includes at least one hole extending through the substrate body with resultant characteristic cavity impressions on the surface of the hole.

7. A molded circuit board comprising:
  a solid non-conductive substrate member formed from a blend of at least two different materials, a first material being an epoxy resin and the second material being a particulate material relatively inert to the epoxy resin and interstitially positioned throughout the first material, at least one surface of the substrate member having a molded recessed predetermined groove pattern wherein the particulate material is substantially removed from the groove pattern surface to provide an irregular cavity surface configuration representative of a chemical etching and dissolving of the surface exposed particulate material to leave only the epoxy resin in a cavity configuration representative of its supporting interface with the particulate material, and
  a conductive material bonded to the substrate member in the recessed predetermined groove pattern and extending into the cavity configurations to improve the adhesion of the conductive material to the substrate member to at least a peel strength greater than 4 lbs./in.

8. The circuit board substrate of claim 7 wherein the molding compound includes epoxy resin and the flame retardant is a compound of antimony trioxide.

9. The circuit board substrate of claim 8 wherein the particles of antimony trioxide are in a size range of 0.2 to 50 microns.

* * * * *